US012764901B2

(12) United States Patent
Li et al.

(10) Patent No.: US 12,764,901 B2
(45) Date of Patent: Oct. 13, 2026

(54) HEAT DISSIPATION APPARATUS AND SERVER

(71) Applicant: HUAWEI TECHNOLOGIES CO., LTD., Shenzhen (CN)

(72) Inventors: Dingfang Li, Dongguan (CN); Hui Jia, Shenzhen (CN); Gaoliang Xia, Dongguan (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 257 days.

(21) Appl. No.: 18/785,125

(22) Filed: Jul. 26, 2024

(65) Prior Publication Data

US 2024/0389262 A1 Nov. 21, 2024

Related U.S. Application Data

(63) Continuation of application No. PCT/CN2023/071954, filed on Jan. 12, 2023.

(30) Foreign Application Priority Data

Jan. 27, 2022 (CN) ......................... 202210102112.2

(51) Int. Cl.
*H05K 7/20* (2006.01)

(52) U.S. Cl.
CPC ..... *H05K 7/20254* (2013.01); *H05K 7/20772* (2013.01)

(58) Field of Classification Search
CPC ...... F28F 2250/08; F28F 2260/02; F28F 1/00; F28F 2250/04; F28F 3/086; H05K 7/20254; H05K 7/20272; H05K 7/20409; H05K 7/20436; H05K 7/20772; H05K 7/20263; H05K 7/2039; H05K 7/20154; H05K 7/20218; H05K 7/20236; H05K 7/208; H05K 7/20872; H05K 7/20927; H10W 40/47; H10W 90/734; H10W 90/754; F28D 15/00; F28D 2021/0029; F28D 2021/0028; G06F 1/20; G06F 2200/201; B23P 2700/10; F04B 17/00
See application file for complete search history.

(56) References Cited

U.S. PATENT DOCUMENTS 6,446,442 B1 * 9/2002 Batchelor ............... F25B 21/02 62/3.2
6,796,370 B1 * 9/2004 Doll ........................ F28F 3/048 257/E23.098

(Continued)

*Primary Examiner* — Michael A Matey

(57) ABSTRACT

A heat dissipation apparatus includes: a cover plate, a flow distribution plate, and a heat dissipation member. A first flow inlet and outlet are disposed in the cover plate, a flow inlet cavity and a flow outlet cavity that are isolated from each other are disposed in the cover plate, the first flow inlet and outlet communicate with the flow inlet and outlet cavity respectively. The heat dissipation member includes a heat dissipation portion, where a heat dissipation flow channel is formed. A second flow inlet and second flow outlets are provided in the flow distribution plate, the second flow inlet communicates with the flow inlet cavity and the heat dissipation flow channel. The second flow outlets are respectively located at the two ends of the heat dissipation flow channel, and communicate with the heat dissipation flow channel and the flow outlet cavity.

20 Claims, 5 Drawing Sheets

(56) References Cited

U.S. PATENT DOCUMENTS

| | | | | |
|---|---|---|---|---|
| 7,149,087 | B2 * | 12/2006 | Wilson | H10W 40/47 174/15.1 |
| 9,310,859 | B2 * | 4/2016 | Barina | G06F 1/20 |
| 9,437,523 | B2 * | 9/2016 | Joshi | H10W 40/475 |
| 9,677,820 | B2 * | 6/2017 | Tsai | F04D 1/003 |
| 9,909,820 | B2 * | 3/2018 | Lyon | F28D 15/00 |
| 10,211,127 | B1 * | 2/2019 | Harris | F28D 15/00 |
| 10,265,812 | B2 * | 4/2019 | Boday | B23P 15/26 |
| 10,739,084 | B2 * | 8/2020 | Tsai | H05K 7/20254 |
| 10,834,847 | B1 * | 11/2020 | Yatskov | H05K 1/0203 |
| 10,842,043 | B1 * | 11/2020 | Zhang | H05K 7/20254 |
| 2007/0103869 | A1 * | 5/2007 | Liu | H10W 40/47 257/E23.098 |
| 2012/0120599 | A1 * | 5/2012 | Chua | F28F 3/12 361/689 |
| 2014/0190669 | A1 * | 7/2014 | Hoshino | F28D 15/0266 165/104.19 |
| 2019/0045662 | A1 * | 2/2019 | Schroeder | H05K 7/20263 |
| 2020/0084913 | A1 * | 3/2020 | Jia | F28F 3/022 |
| 2020/0227341 | A1 * | 7/2020 | Neal | F28F 3/12 |
| 2021/0239310 | A1 * | 8/2021 | Zhou | F21V 29/75 |
| 2025/0081387 | A1 * | 3/2025 | Liao | H05K 7/20272 |
| 2025/0254822 | A1 * | 8/2025 | Zhang | H05K 7/20254 |

* cited by examiner

HEAT DISSIPATION APPARATUS AND SERVER

CROSS-REFERENCE TO RELATED APPLICATIONS

This application is a continuation of International Application No. PCT/CN2023/071954, filed on Jan. 12, 2023, which claims priority to Chinese Patent Application No. 202210102112.2, filed on Jan. 27, 2022. The disclosures of the aforementioned applications are hereby incorporated by reference in their entireties.

TECHNICAL FIELD

Embodiments of this disclosure relate to the field of server technologies, and in particular, to a heat dissipation apparatus and a server.

BACKGROUND

In the era of the internet, big data, and cloud computing, higher requirements are raised for transmission and processing speeds, a storage capability, and a high-performance computing capability for massive data. The market requires a faster computing speed of servers, leading to a continuous increase in power consumption of various chips. A chip of a server generates a large amount of heat in a process of performing intensive computing, and the chip is overheated. As a result, a processing capability of the chip is reduced or even the chip is damaged.

To prevent the server from crashing or being damaged, a heat dissipation system usually needs to be disposed to dissipate heat for the chip. An existing heat dissipation system mainly includes an air cooling heat dissipation system and a liquid cooling heat dissipation system, and the liquid cooling heat dissipation system is widely used for its outstanding heat dissipation performance. In a related technology, a conventional liquid cooling heat dissipation system includes: a skived fin plate and an upper cover plate. The upper cover plate covers the skived fin plate and is connected to the skived fin plate in a sealed manner. A liquid inlet and a liquid outlet are disposed in the upper cover plate. Heat dissipation liquid enters from the liquid inlet, flows into the skived fin plate from one end of the skived fin plate, flows out of the skived fin plate from the other end of the skived fin plate, takes away heat dissipated by a chip, and all flows out of the liquid cooling heat dissipation system from the liquid outlet.

However, because a spacing between skived fins on the skived fin plate is small, and a flow channel path is long, a large pressure drop loss of the heat dissipation liquid in the flow channel is caused for the heat dissipation liquid flows from one end of the skived fin to the other end. Consequently, a heat dissipation capability of the liquid cooling heat dissipation system is reduced.

SUMMARY

Embodiments of this disclosure provide a heat dissipation apparatus and a server, to shorten a pass path of a working medium, reduce a pressure drop loss of the working medium in a flow channel, and improve a heat dissipation capability of the heat dissipation apparatus.

An aspect of embodiments of this disclosure provides a heat dissipation apparatus, including a cover plate, a flow distribution plate, and a heat dissipation member. A first flow inlet and a first flow outlet are disposed in the cover plate, a flow inlet cavity and a flow outlet cavity that are isolated from each other are disposed in the cover plate, the first flow inlet communicates with the flow inlet cavity, the first flow outlet communicates with the flow outlet cavity, and the cover plate is connected to one side of the flow distribution plate in a sealed manner. The heat dissipation member is connected to the other side of the flow distribution plate in a sealed manner, the heat dissipation member and the flow distribution plate form a sealed cavity, the heat dissipation member includes a heat dissipation portion, the heat dissipation portion is located in the sealed cavity, and a heat dissipation flow channel is formed in the heat dissipation portion. A second flow inlet and at least two second flow outlets are provided in the flow distribution plate, the second flow inlet communicates with the flow inlet cavity and the heat dissipation flow channel, and the second flow inlet is located between two ends of the heat dissipation flow channel. Two of the at least two second flow outlets are respectively located at the two ends of the heat dissipation flow channel, and the at least two second flow outlets communicate with the heat dissipation flow channel and the flow outlet cavity. According to the heat dissipation apparatus provided in this embodiment of this disclosure, after the working medium enters the heat dissipation flow channel from the second flow inlet, the working medium may be distributed to the two ends of the heat dissipation flow channel. A flow path of the working medium is shortened, a pressure drop loss is reduced, and a heat dissipation capability of the heat dissipation apparatus can be improved. In addition, compared with a manner of disposing a liquid return flow channel in the heat dissipation member, invalid space occupied by a contact plane between the heat dissipation member and the chip can be reduced. When an area of the contact plane between the heat dissipation member and the chip is fixed, the heat dissipation portion may be designed to be larger. In other words, an effective heat dissipation area is increased, thereby improving a heat dissipation capability of the heat dissipation apparatus. In addition, after the working medium takes away the heat, confluence occurs at the flow outlet cavity in a height direction, and there is no need to dispose two liquid outlets, so that a volume and a weight of the heat sink can be reduced, and manufacturing costs and assembly costs can be reduced.

In a possible implementation, the heat dissipation member further includes a bearing plate, the heat dissipation portion is disposed on the bearing plate, the bearing plate is connected to the flow distribution plate in a sealed manner, and the bearing plate and the flow distribution plate are enclosed to form the sealed cavity. The bearing plate, an end face of the heat dissipation portion, and the flow distribution plate are enclosed to form two confluence cavities, the two confluence cavities are respectively located at the two ends of the heat dissipation flow channel, and the two confluence cavities both communicate with the heat dissipation flow channel. One of the at least two second flow outlets communicates with one of the two confluence cavities and the flow outlet cavity.

The other of the at least two second flow outlets communicates with the other of the two confluence cavities and the flow outlet cavity. The working medium flows through the heat dissipation flow channels in the heat dissipation portion, converges in the two confluence cavities, and then enters the flow outlet cavity from the second flow outlet, so that it can be ensured that the working medium can flow through the entire heat dissipation portion, and heat dissipation performance of the heat dissipation apparatus can be improved.

In a possible implementation, the flow distribution plate includes: a flow distribution plate main body and an isolation plate extending toward the bearing plate. The isolation plate covers the bearing plate and is welded with the bearing plate in a sealed manner. The top of the heat dissipation portion is welded to the flow distribution plate main body. The isolation plate, the flow distribution plate main body, the bearing plate, and the end face of the heat dissipation portion are enclosed to form the two confluence cavities. The top of the heat dissipation portion is welded to the flow distribution plate main body, so that the heat dissipation member and the flow distribution plate are formed as a whole. This improves a pressure resistance capability of the heat dissipation member and provides support for thinning the heat dissipation member. In addition, the top of the heat dissipation portion is welded to the flow distribution plate main body, so that zero-gap cooperation between the heat dissipation portion and the flow distribution plate can be implemented, thereby avoiding that the working medium is distributed to an invalid region, and improving heat dissipation efficiency of the heat dissipation apparatus.

In a possible implementation, the flow inlet cavity includes: a direct flow cavity and a cyclone flow cavity that communicates with the direct flow cavity. The direct flow cavity communicates with the first flow inlet, and the second flow inlet communicates with the cyclone flow cavity and the heat dissipation flow channel. The cyclone flow cavity is configured to perform cyclone flow acceleration on a fluid. After passing through the direct flow cavity, the working medium turns to the cyclone flow cavity, and cyclone flow acceleration may be implemented in the cyclone flow cavity. This increases fluid pressure when the working medium enters the heat dissipation flow channel, and further improves heat dissipation effect of the heat dissipation apparatus.

In a possible implementation, the heat dissipation apparatus further includes a bracket. The bracket is assembled on a mainboard on which the chip is mounted. A mounting hole is provided in the bracket, the heat dissipation member is assembled in the mounting hole, and the flow distribution plate is connected to the bracket. The heat dissipation member is assembled in the mounting hole, so that the heat dissipation member is closer to a chip that needs heat dissipation, and heat transfer efficiency is improved.

In a possible implementation, the first flow inlet and the first flow outlet are disposed in a side wall of the cover plate.

In a possible implementation, the heat dissipation flow channel includes a plurality of heat dissipation flow sub-channels, the heat dissipation portion includes a plurality of fins, the plurality of heat dissipation flow sub-channels are formed between the plurality of fins, and tops of the plurality of fins are welded to the flow distribution plate main body. A plurality of heat dissipation flow channels may increase heat dissipation efficiency of the heat dissipation apparatus. In addition, the heat dissipation member having a plurality of fins may be a skived fin plate, and the skived fin plate has a large heat dissipation area and stable heat dissipation performance.

In a possible implementation, the heat dissipation member is configured to be in contact with the chip to dissipate heat for the chip. The heat dissipation member in the heat dissipation apparatus is in contact with the chip, so that heat conduction performance between the chip and the heat dissipation member can be improved, thereby improving heat dissipation efficiency of the heat dissipation apparatus.

In a possible implementation, a cross section of the bearing plate and a cross section of the heat dissipation portion are both rectangular. It may be understood that the bearing plate is generally a rectangular plate, so that the bearing plate can be easily mounted. Certainly, a shape of the bearing plate may be specifically set based on a working condition, and is not limited to the rectangular plate. The heat dissipation portion is a rectangular body, and a length of the heat dissipation flow channel can be fully increased. For example, when the heat dissipation portion is a circular body, the middle heat dissipation flow channel is longer, and the heat dissipation flow channels on two sides are shorter.

Another aspect of embodiments of this disclosure provides a server, including a mainboard, a chip disposed on the mainboard, and the heat dissipation apparatus described above. The heat dissipation apparatus is configured to dissipate heat for the chip. According to the server provided in this embodiment of this disclosure, in the heat dissipation apparatus of the server, after the working medium enters the heat dissipation portion from the second flow inlet, the working medium may be distributed to the two ends of the heat dissipation portion. A flow path of the working medium is shortened, a pressure drop loss is reduced, and a heat dissipation capability of the heat dissipation apparatus can be improved. In addition, compared with a manner of disposing a liquid return flow channel in the heat dissipation member, invalid space occupied by a contact plane between the heat dissipation member and the chip can be reduced. When an area of the contact plane between the heat dissipation member and the chip is fixed, the heat dissipation portion may be designed to be larger. In other words, an effective heat dissipation area is increased, thereby improving a heat dissipation capability of the heat dissipation apparatus. In addition, after the working medium takes away the heat, confluence occurs at the flow outlet cavity in a height direction, and there is no need to dispose two liquid outlets, so that a volume and a weight of the heat sink can be reduced, and manufacturing costs and assembly costs can be reduced.

DESCRIPTIONS OF REFERENCE NUMERALS

Figure 1:
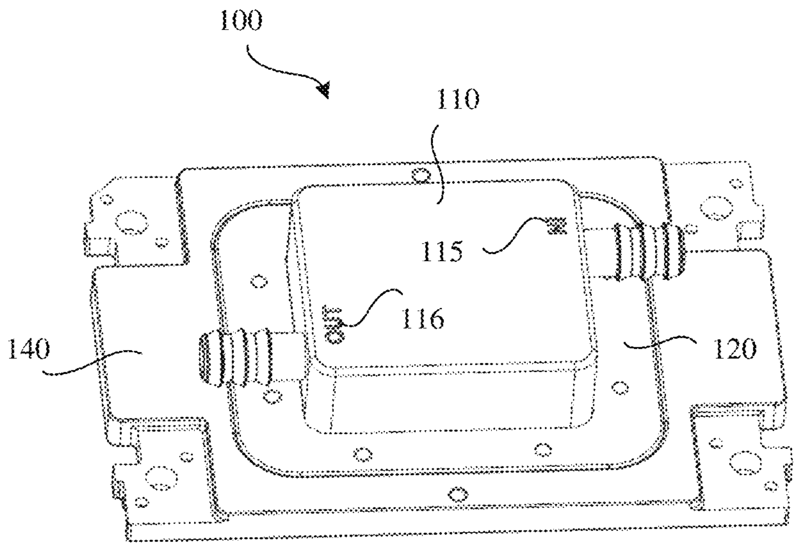
FIG. 1 is a diagram of a server including a structure of a heat dissipation apparatus according to an embodiment of this disclosure.

100: heat dissipation apparatus;

110: cover plate; 111: first flow inlet; 112: first flow outlet;

113: flow inlet cavity; 1131: direct flow cavity; 1132: cyclone flow cavity;
114: flow outlet cavity; 115: flow inlet identifier; 116: flow outlet identifier;
120: flow distribution plate; 121: second flow inlet; 122: second flow outlet;
123: flow distribution plate main body; 124: isolation plate; 1241: welding face;
130: heat dissipation member; 131: bearing plate; 1311: limiting step;
132: heat dissipation portion; 1321: heat dissipation flow channel; 1322: fin;
133: confluence cavity;
140: bracket; 141: mounting hole.

DESCRIPTION OF EMBODIMENTS

Terms used in implementations of this disclosure are merely used to explain specific embodiments of this disclosure, but are not intended to limit this disclosure. The following describes implementations of embodiments of this disclosure in detail with reference to the accompanying drawings.

With rapid development of internet technologies, the market has an increasingly high requirement on a computing speed of a server and a memory. Consequently, power consumption of various chips continuously increases. A conventional liquid cooling heat sink cannot meet a heat dissipation requirement of various chips, and a liquid cooling heat sink with a stronger heat dissipation capability is urgently required.

In a related technology, most liquid cooling heat sinks dissipate heat for a chip in a front-to-back through-flow manner. To be specific, a conventional liquid cooling heat sink usually includes: a skived fin plate and an upper cover plate. The upper cover plate covers the skived fin plate in a form of cover body. A liquid inlet and a liquid outlet are respectively disposed on two opposite ends of the top of the upper cover plate. Heat dissipation liquid enters a cavity enclosed by the upper cover plate and the skived fin plate from the liquid inlet, then flows through a plurality of liquid cooling flow channels formed by skived fins, takes away heat dissipated by the chip, and then flows out of the liquid cooling heat sink from the liquid outlet. However, in this solution, the liquid cooling flow channel formed by the skived fins has a long path, and a pressure drop loss of the heat dissipation liquid in the liquid cooling flow channel is large. In addition, a larger corresponding chip indicates a larger pressure drop loss. Consequently, a heat dissipation capability of the liquid cooling heat sink is reduced, and a market requirement for a heat dissipation capability of the heat sink cannot be met.

To resolve this problem, the heat sink may dissipate heat for the chip in an intermediate through-flow manner, and the liquid cooling heat sink in this manner still includes: a skived fin plate and an upper cover plate. The upper cover plate covers the skived fin plate in a form of cover body. A liquid inlet and a liquid outlet are disposed on the top of the upper cover plate. After heat dissipation liquid enters a cavity enclosed by the upper cover plate and the skived fin plate from the liquid inlet, the heat dissipation liquid directly enters a liquid cooling flow channel formed by skived fins from a middle part of the skived fins. The heat dissipation liquid is distributed into two streams that respectively flow from a middle part of the liquid cooling flow channel to two ends of the liquid cooling flow channel, to take away heat dissipated by the chip. One stream of the heat dissipation liquid flows directly to a confluence cavity disposed near the liquid outlet and flows out of the liquid cooling heat sink from the liquid outlet, and the other stream of the heat dissipation liquid flows back to the confluence cavity from the liquid return flow channel disposed in the side of the skived fins, and then flows out of the liquid cooling heat sink from the liquid outlet.

However, the Liquid Cooling Heat Sink in this Solution Still has Several Main Problems:

1. The liquid return flow channel needs to be provided to enable the other stream of the heat dissipation liquid to flow back to the liquid outlet. The liquid return flow channel needs to occupy an area of the skived fin plate. In addition, a larger heat dissipation area of the chip indicates a larger flow volume of the heat dissipation liquid, and the liquid return flow channel needs to be set to be larger, thereby greatly reducing a heat dissipation rate of the skived fin plate. It may be understood that, if a heat dissipation area of the chip is fixed, because a liquid return flow channel needs to be disposed in the skived fin plate, an effective heat dissipation area of the skived fin plate is reduced. When the chip size is large or the space of the skived fin plane is limited, design of the skived fin is limited.
2. If two liquid outlets are provided in the upper cover plate, the two streams of the heat dissipation liquid respectively flow out from the two liquid outlets. Apparently, in this manner, a volume and a weight of the liquid cooling heat sink are increased, and costs are increased. Two liquid return pipes need to be connected, and assembly is complex.
3. Because both internal and external pressures of the liquid cooling heat sink are high (for example, the internal pressure is hydraulic pressure of the heat dissipation liquid, and the external pressure is a spring force for fastening the liquid cooling heat sink), the skived fin plate is usually designed to be thick, and is usually 3 mm to 5 mm, to meet overall strength of the liquid cooling heat sink. However, if the skived fin plate is thick, thermal resistance is high, and the heat dissipation capability of the liquid cooling heat sink cannot be perfectly implemented. Thinning skived fin plate brings about strength problems, and high internal and external pressure will cause deformation of the skived fin plate.

To resolve the foregoing problem, embodiments of this disclosure provide a heat dissipation apparatus and a server. The heat dissipation apparatus includes a cover plate, a flow distribution plate, and a heat dissipation member. A first flow inlet disposed in the cover plate communicates with a flow inlet cavity in a cavity of the cover plate, and a first flow outlet disposed in the cover plate communicates with a flow outlet cavity in the cavity of the cover plate. The flow distribution plate is disposed between the cover plate and the heat dissipation member, and a second flow inlet and at least two second flow outlets are provided in the flow distribution plate. The second flow inlet is located in a middle part of a heat dissipation portion of the heat dissipation member, and communicates with the flow inlet cavity and the heat dissipation portion. Two of the at least two second flow outlets are respectively located at two ends of the heat dissipation portion, and communicate with the heat dissipation portion and the flow outlet cavity. A flowing route of a fluid is: the first flow inlet—the flow inlet cavity—the second flow inlet—the heat dissipation portion—the second flow outlet—the flow outlet cavity—the first flow outlet, and then the fluid is sent out of the heat dissipation apparatus.

In this disclosure, a working medium is distributed from the middle part to the two outer ends of the heat dissipation portion, and a pass path is short, so that a pressure drop loss can be reduced, and a heat dissipation capability of the heat dissipation apparatus can be improved. In addition, in this disclosure, the flow distribution plate may be used to implement flow distribution from high space, and a liquid return flow channel does not need to be disposed in the heat dissipation member, so that space occupied by a contact plane between the heat dissipation member and the chip is reduced, and a designable area of the heat dissipation portion is larger, that is, an effective heat dissipation area may be larger. In this way, a heat dissipation capability of the heat dissipation apparatus may be improved when space is limited. In addition, this disclosure further relates to a design in which the heat dissipation member can be thinned, to reduce thermal resistance of the heat dissipation member, and improve a heat dissipation capability of the heat dissipation apparatus.

The following describes in detail the heat dissipation apparatus and the server provided in this disclosure with reference to the accompanying drawings and specific embodiments.

For ease of understanding of the heat dissipation apparatus provided in embodiments of this disclosure, the following first describes an application scenario of the heat dissipation apparatus provided in embodiments of this disclosure. The heat dissipation apparatus is usually configured to dissipate heat for a server, a memory, or the like that has high power and generates a large amount of heat. In this disclosure, heat dissipation for a chip of a server is used as an example for description. The chip of the server may be a bare die or a non-bare die, but is not limited to the foregoing two types. A chip that needs to be protected by a protection cover plate is referred to as a non-bare die, and a chip that does not need to be protected by a protection cover plate is referred to as a bare die. The chip includes: a central processing unit (CPU), artificial intelligence (AI), a system on chip (SOC), and other high-power chips that require separate heat dissipation.

Figure 2:
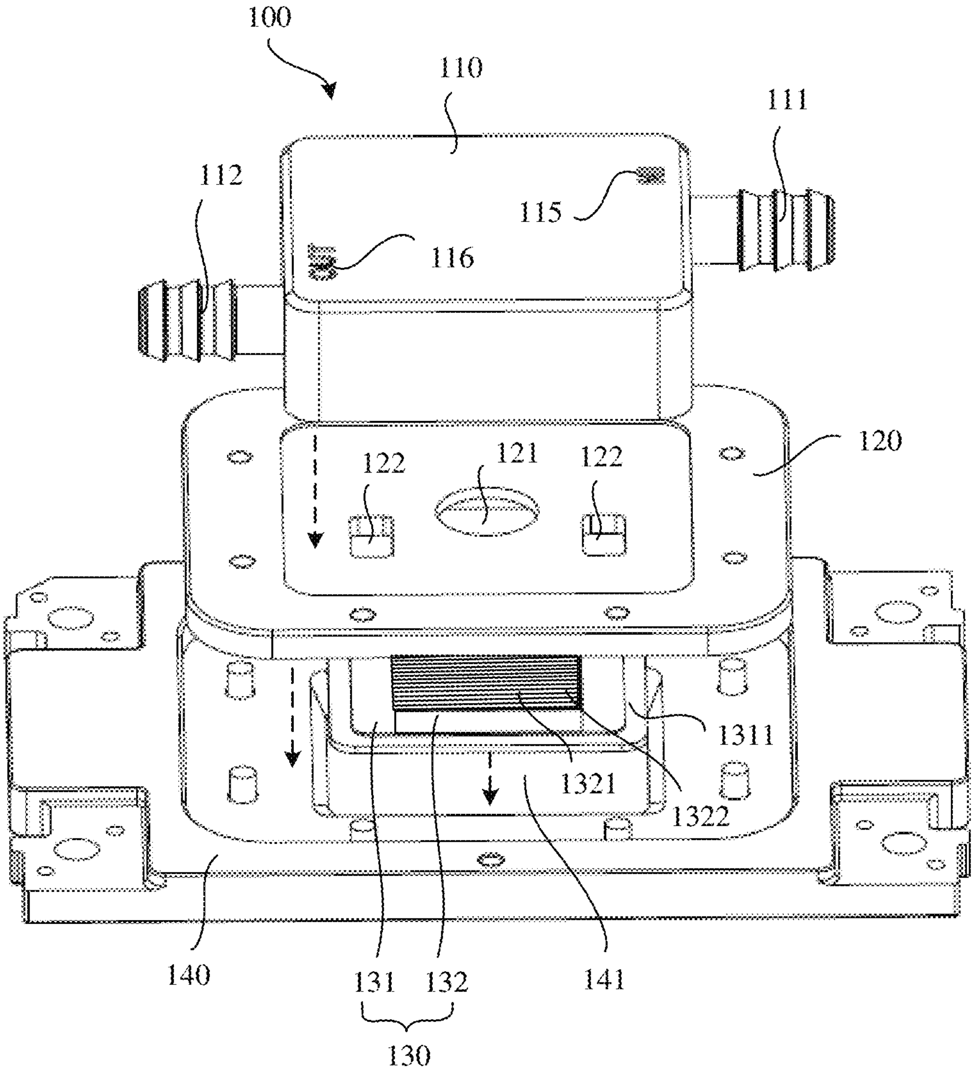
FIG. 2 is an exploded diagram of a structure of a heat dissipation apparatus according to an embodiment of this disclosure.

An embodiment of this disclosure provides a server. As depicted in FIG. 1, a server includes a mainboard, a chip disposed on the mainboard, and a heat dissipation apparatus 100 for heat dissipation of the chip. The heat dissipation apparatus 100 of the server is configured to dissipate heat for the chip. For example, the heat dissipation apparatus 100 may be fastened on the mainboard and may be located right above the chip. The heat dissipation apparatus 100 is in direct contact or indirect contact with the chip. Usually, a heat dissipation member 130 (as shown in FIG. 2) in the heat dissipation apparatus 100 is in direct contact or indirect contact with the chip, to take away heat generated during operation of the chip.

FIG. 1 is a diagram of a server including a structure of a heat dissipation apparatus 100 according to an embodiment of this disclosure. FIG. 2 is an exploded diagram of a structure of the heat dissipation apparatus 100 according to an embodiment of this disclosure. With reference to FIG. 1 and FIG. 2, the heat dissipation apparatus 100 provided in this embodiment of this disclosure includes a cover plate 110, a flow distribution plate 120, and a heat dissipation member 130.

The cover plate 110 is connected to one side of the flow distribution plate 120 in a sealed manner. For example, as shown in FIG. 2, the cover plate 110 covers a top face of the flow distribution plate 120 in a form of cover body, and the cover plate 110 ensures that a working medium does not flow out of a joint between the cover plate 110 and the flow distribution plate 120 in a manner of sealing welding, setting a sealing ring, or the like. The heat dissipation member 130 is connected to a bottom face of the flow distribution plate 120 in a sealed manner to form a sealed cavity. Similarly, an isolation cover may be disposed in a side that is of the flow distribution plate 120 and that faces the heat dissipation member 130, and the isolation cover covers the heat dissipation member 130; or the isolation cover is disposed on the heat dissipation member 130 to cover the flow distribution plate 120, forms the sealed cavity in a manner of sealing welding, setting a sealing ring, or the like, to ensure that a working medium does not flow out of a joint between the flow distribution plate 120 and the heat dissipation member 130.

Figure 3:
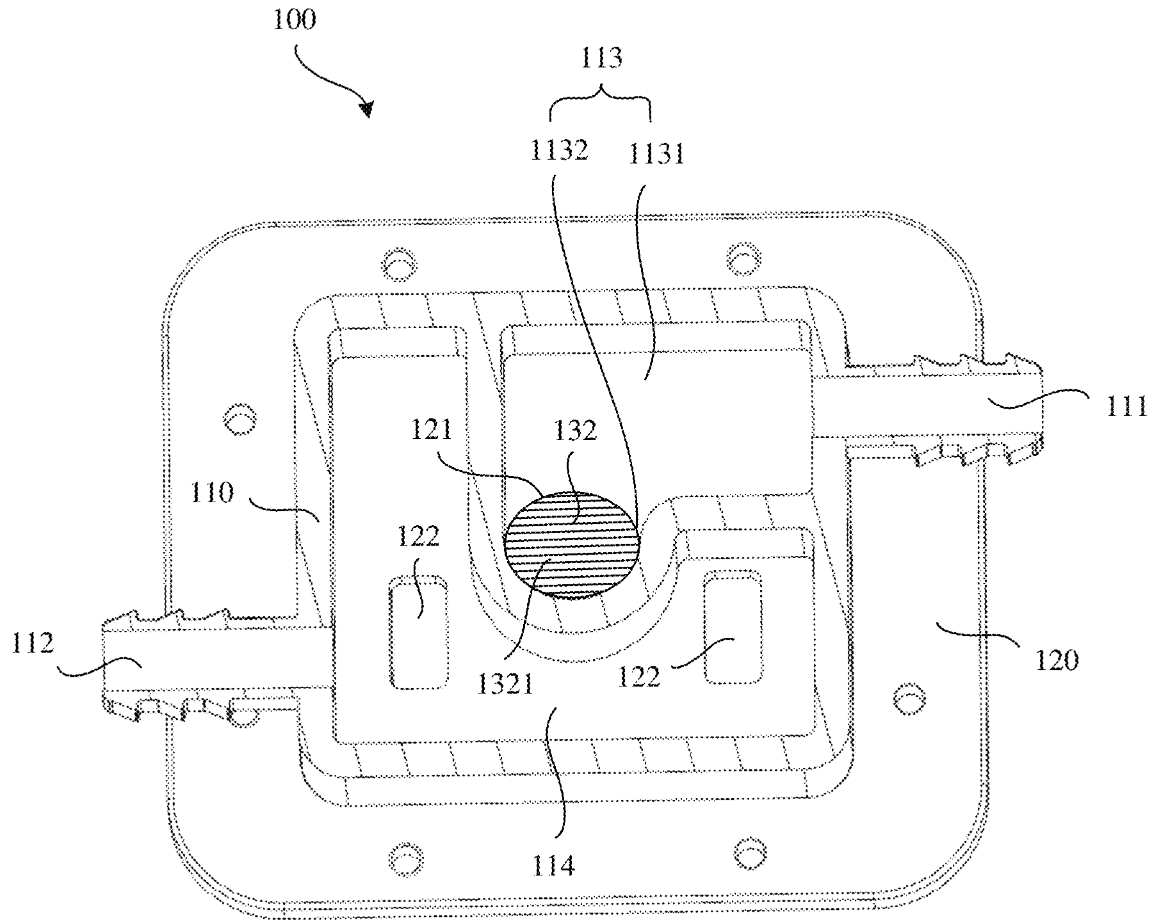
FIG. 3 is a transverse sectional view of a heat dissipation apparatus according to an embodiment of this disclosure.

FIG. 3 is a transverse sectional view of the heat dissipation apparatus 100 according to an embodiment of this disclosure. With reference to FIG. 2 and FIG. 3, in the heat dissipation apparatus 100 provided in this disclosure, a first flow inlet 111 and a first flow outlet 112 are disposed in the cover plate 110. It may be understood that the first flow inlet 111 and the second flow outlet 122 may be holes provided in the cover plate 110. Alternatively, as shown in FIG. 2 or FIG. 3, an opening provided in the cover plate 110 may be connected to a pipe, and the opening and the pipe are collectively referred to as the first flow inlet 111 or the first flow outlet 112.

A flow inlet cavity 113 and a flow outlet cavity 114 that are isolated from each other are disposed in the cover plate 110, the first flow inlet 111 communicates with the flow inlet cavity 113, and the first flow outlet 112 communicates with the flow outlet cavity 114. The working medium flows into the flow inlet cavity 113 from the first flow inlet 111, flows back to the flow outlet cavity 114 after flowing through the heat dissipation member 130, and then flows out of the heat dissipation apparatus 100 from the first flow outlet 112.

Still with reference to FIG. 2 and FIG. 3, the heat dissipation member 130 may include a bearing plate 131 and a heat dissipation portion 132 located on the bearing plate 131. A heat dissipation flow channel 1321 is formed in the heat dissipation portion 132. The bearing plate 131 is configured to bear the heat dissipation portion 132. In addition, the bearing plate 131 is configured to form a sealed cavity enclosed with the flow distribution plate 120 to prevent leakage of the working medium. The heat dissipation portion 132 of the bearing plate 131 is located in the sealed cavity.

A second flow inlet 121 and at least two second flow outlets 122 are provided in the flow distribution plate 120. The second flow inlet 121 communicates with the flow inlet cavity 113 and the heat dissipation flow channel 1321. Two of the at least two second flow outlets 122 are respectively located at two ends of the heat dissipation flow channel 1321. To be specific, at least one second flow outlet 122 is located at one end of the heat dissipation flow channel 1321, and at least one second flow outlet 122 is located at the other end of the heat dissipation flow channel 1321. For example, when there are three second flow outlets 122, one end of the heat dissipation flow channel 1321 may have one second flow outlet 122, and the other end may have one or two second flow outlets 122. It should be noted that, in this disclosure, a position relationship between two components that are not in one plane (for example, the second flow outlet 122 and the heat dissipation flow channel 1321 that are not in one plane) is a position relationship between projections in a vertical direction (namely, a direction perpendicular to a plane of the flow distribution plate 120). Therefore, the two of the at least two second flow outlets 122 are respectively located at the two ends of the heat dissipation flow channel 1321. In other words, a projection of at least one second flow outlet 122 in the vertical direction is located at one end of the projection of the heat dissipation flow channel 1321 in the vertical direction, and a projection of at least the other second flow outlet 122 is located at the other end of the projection of the heat dissipation flow channel 1321 in the vertical direction.

For example, in this disclosure, there are two second flow outlets 122 for description. The heat dissipation flow channel 1321 is a left-to-right direct flow channel, and the direct flow channel may reduce a pressure drop of the working medium in the heat dissipation flow channel 1321. Certainly, the heat dissipation flow channel 1321 may alternatively be a curved flow channel. The two second flow outlets 122 are respectively located at the left end and the right end of the heat dissipation flow channel 1321, and the second flow outlets 122 communicate with the heat dissipation flow channel 1321 and the flow outlet cavity 114. The second flow inlet 121 is located between the two ends of the heat dissipation flow channel 1321. In other words, the second flow inlet 121 is located between the two second flow outlets 122.

A flow path of the working medium is as follows: The working medium enters the flow inlet cavity 113 from the first flow inlet 111, and enters the heat dissipation flow channel 1321 of the heat dissipation portion 132 from the second flow inlet 121. The working medium is distributed at the middle part of the heat dissipation flow channel 1321 to the two ends of the heat dissipation flow channel 1321. After taking away heat dissipated during operation of the chip, the working medium separately flows back to the flow outlet cavity 114 from the two second flow outlets 122, and then flows out of the heat dissipation apparatus 100 from the first flow outlet 112.

It should be understood that, according to the heat dissipation apparatus 100 provided in this embodiment of this disclosure, after the working medium enters the heat dissipation portion 132 from the second flow inlet 121, the working medium may be distributed to the two ends of the heat dissipation flow channel 1321. A flow path of the working medium is shortened, a pressure drop loss is reduced, and a heat dissipation capability of the heat dissipation apparatus 100 can be improved. In addition, compared with a manner of disposing a liquid return flow channel in the heat dissipation member 130, invalid space occupied by a contact plane between the heat dissipation member 130 and the chip can be reduced. When an area of the contact plane between the heat dissipation member 130 and the chip is fixed, the heat dissipation portion 132 may be designed to be larger. In other words, an effective heat dissipation area is increased, thereby improving a heat dissipation capability of the heat dissipation apparatus 100. In addition, after the working medium takes away the heat, confluence occurs at the flow outlet cavity 114 in a height direction, and there is no need to dispose two liquid outlets, so that a volume and a weight of the heat sink can be reduced, and manufacturing costs and assembly costs can be reduced.

It should be noted that, in this embodiment of this disclosure, the state of the working medium for heat dissipation is not limited to a liquid state, and may also be a solid state or a gas, provided that the working medium is a substance that can transfer heat. This is not limited herein.

Figure 4:
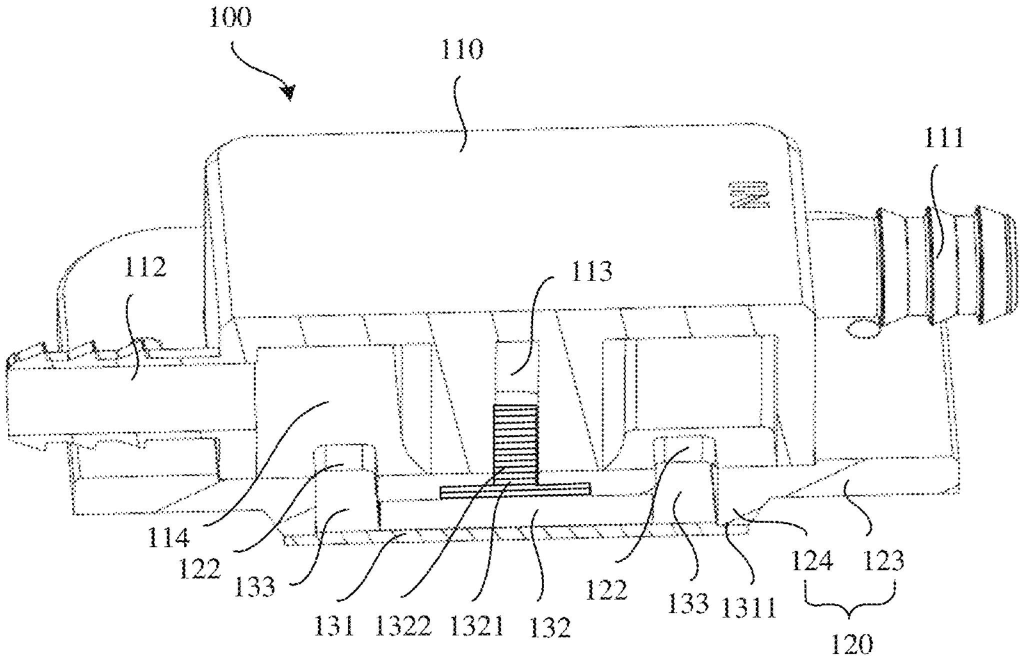
FIG. 4 is a vertical sectional view of a heat dissipation apparatus according to an embodiment of this disclosure.

FIG. 4 is a vertical sectional view of the heat dissipation apparatus 100 according to an embodiment of this disclosure. With reference to FIG. 4, in some embodiments of this disclosure, to enable the working medium flow through the entire heat dissipation portion 132, the bearing plate 131, end faces (which may be understood as the left end face and the right end face of the heat dissipation portion 132 in FIG. 4) of the heat dissipation portion 132 are enclosed with the flow distribution plate 120 to form two confluence cavities 133. The two confluence cavities 133 are respectively located at the two ends of the heat dissipation flow channel 1321. The two confluence cavities 133 both communicate with the heat dissipation flow channel 1321. In addition, one of the at least two second flow outlets 122 communicates with one of the two confluence cavities 133 and the flow outlet cavity 114, and the other of the at least two second flow outlets 122 communicates with the other of the two confluence cavities 133 and the flow outlet cavity 114. For example, in FIG. 4, the second flow outlet 122 located at the left end of the heat dissipation flow channel 1321 communicates with the confluence cavity 133 and the flow outlet cavity 114 at the left end of the heat dissipation flow channel 1321, the second flow outlet 122 located at the right end of the heat dissipation flow channel 1321 communicates with the confluence cavity 133 and the flow outlet cavity 114 at the right end of the heat dissipation flow channel 1321, and the working medium is collected in the two confluence cavities 133 after flowing through the heat dissipation flow channel 1321 in the heat dissipation portion 132, and then enters the flow outlet cavity 114 from the second flow outlet 122.

Figure 5:
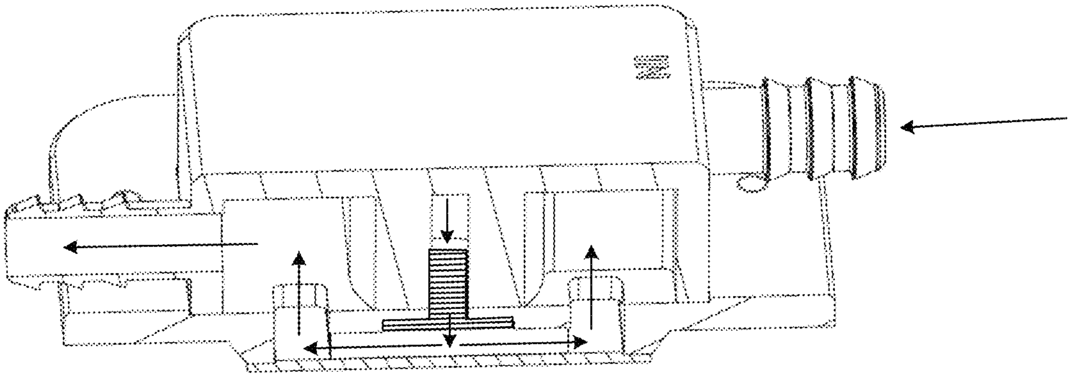
FIG. 5 is a diagram of a flow direction of a working medium of a heat dissipation apparatus according to an embodiment of this disclosure.

In this case, a flow path of the working medium is as follows: The working medium enters the flow inlet cavity 113 from the first flow inlet 111, and enters the heat dissipation flow channel 1321 in the heat dissipation portion 132 from the second flow inlet 121. The working medium is distributed at the middle part of the heat dissipation flow channel 1321 to the two ends of the heat dissipation flow channel 1321. After taking away heat dissipated during operation of the chip, the working medium separately flows into the confluence cavities 133 located at the two ends of heat dissipation portion 132, then flows back to the flow outlet cavity 114 from the two second flow outlets 122, and finally flows out of the heat dissipation apparatus 100 from the first flow outlet 112. For a flow direction of the working medium, refer to a direction indicated by an arrow in FIG. 5.

A volume of the confluence cavity 133 may be greater than or equal to 0. In other words, the size of the confluence cavity 133 may be set based on a specific working condition. When the volume of the confluence cavity 133 is 0, that is, in some other embodiments of this disclosure, there is no confluence cavity 133, and the second flow outlet 122 is disposed right above the two ends of the body of the heat dissipation portion 132. A shape and a size of the confluence cavity 133 are not limited herein.

With reference to FIG. 4, the heat dissipation flow channel 1321 includes a plurality of heat dissipation flow sub-channels, and the plurality of heat dissipation flow sub-channels form the heat dissipation flow channel 1321. The heat dissipation portion 132 may include a plurality of fins 1322, and the plurality of fins 1322 form the plurality of heat dissipation flow sub-channels. Usually, the plurality of fins are vertically disposed in parallel, and one heat dissipation flow sub-channel is formed between two adjacent fins, so that the plurality of fins may form the plurality of heat dissipation flow sub-channels. The heat dissipation flow channel 1321 communicates with the flow inlet cavity 113 and the confluence cavity 133. The heat dissipation member

130 formed by the bearing plate 131 and the plurality of fins 1322 may be a skived fin plate.

Simply speaking, the skived fin plate is a whole metal plate that is cut, based on a requirement, into fins with a standard spacing and specific fin thickness and fin height by using a dedicated skived fin machine. The high-precision cutting technology and integrated molding are used. Compared with other processing technologies, the raw materials of the same volume can be cut to obtain a larger heat dissipation area and more stable heat transfer performance. Compared with a crimped fin heat sink, the heat dissipation efficiency can be improved by 10% to 30%, thereby greatly improving the heat dissipation efficiency and prolonging the service life of the heating component.

The fins may be metal that is not easily heated and expanded, such as a copper sheet, an aluminum sheet, or a silver sheet. In addition, these metal materials have good heat conduction performance, and do not affect heat conduction efficiency of the heat dissipation member 130.

It should be mentioned that the bearing plate 131 and the heat dissipation portion 132 may use a same material, so that there is no thermal contact resistance between the heat dissipation portion 132 and the bearing plate 131. This improves a heat dissipation capability of the heat dissipation member 130.

Figure 4A:
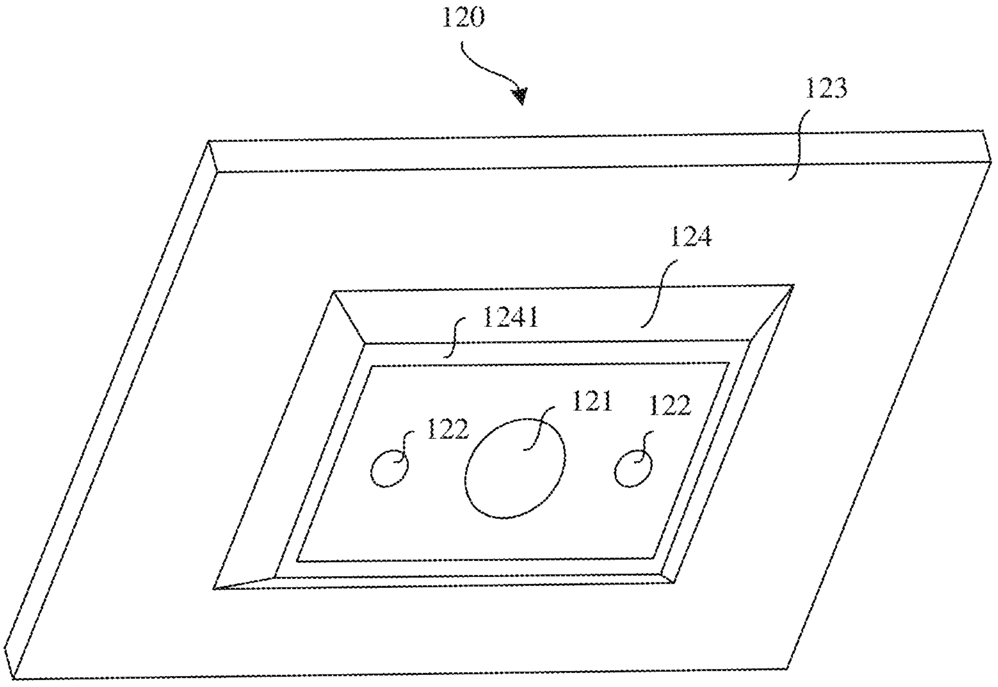
FIG. 4*a* is a diagram of a structure of a flow distribution plate according to an embodiment of this disclosure.

FIG. 4*a* is a diagram of a structure of a flow distribution plate according to an embodiment of this disclosure. With reference to FIG. 4 and FIG. 4*a*, in some embodiments of this disclosure, the flow distribution plate 120 may include a flow distribution plate main body 123 and an isolation plate 124 extending toward the bearing plate 131. The isolation plate 124 is located at the bottom of the bearing plate 131. The isolation plate 124 covers the bearing plate 131 in a form of cover body and is welded to the bearing plate 131 in a sealed manner. For example, as shown in FIG. 4*a*, the isolation plate 124 is in an inverted frustum shape, the inverted-frustum-shaped isolation plate 124 facilitates sealing welding between a welding face 1241 of the isolation plate 124 and the bearing plate 131. The middle of the isolation plate 124 is a hollow part. After the isolation plate 124 is welded to the bearing plate 131 in a sealed manner, the hollow part and the bearing plate 131 form a sealed cavity for accommodating the heat dissipation member 130, to ensure that the working medium does not leak. In addition, the top of the heat dissipation portion 132 is welded to the flow distribution plate main body 123. When the heat dissipation portion 132 includes a plurality of fins 1322, the top of the fins 1322 is welded to the flow distribution plate main body 123. In this case, the isolation plate 124, the flow distribution plate main body 123, the bearing plate 131, and the end face of the heat dissipation portion 132 are enclosed to form two confluence cavities 133 that are respectively located at the two ends of the heat dissipation flow channel 1321.

Certainly, in another embodiment of this disclosure, the bearing plate 131 may also have an isolation plate extending toward the flow distribution plate main body 123, and the isolation plate is welded to the flow distribution plate main body 123 in a sealed manner.

It may be understood that, in a conventional heat sink, to resist internal and external pressure, a skived fin plate is usually designed to be thicker, which is usually 3 mm to 5 mm. However, the skived fin plate is thicker, and the thermal resistance of the skived fin plate is correspondingly larger. As a result, a heat dissipation capability of the heat sink is not high. If a heat dissipation capability needs to be improved, the skived fin plate needs to be thinned. In a conventional heat sink, thinning of the skived fin plate leads to an insufficient pressure resistance capability of the skived fin plate and deformation of the skived fin plate. In the heat dissipation apparatus 100 provided in this embodiment of this disclosure, the bearing plate 131 is welded to the flow distribution plate 120 in a sealed manner, and the top of the heat dissipation portion 132 is welded to the flow distribution plate 120, so that the heat dissipation member 130 and the flow distribution plate 120 form an entirety. This improves a pressure resistance capability of the heat dissipation member 130, and supports thinning of the heat dissipation member 130. When the heat dissipation member 130 is a skived fin plate, the skived fin plate can be thinned to 0.6 mm to 1.5 mm. This greatly reduces material costs and further improves a heat dissipation capability. In addition, the top of the heat dissipation portion 132 is welded to the flow distribution plate 120, so that zero-gap cooperation between the heat dissipation portion 132 and the flow distribution plate 120 can be implemented, thereby avoiding that the working medium is distributed to an invalid region, and improving heat dissipation efficiency of the heat dissipation apparatus 100.

Figure 6:
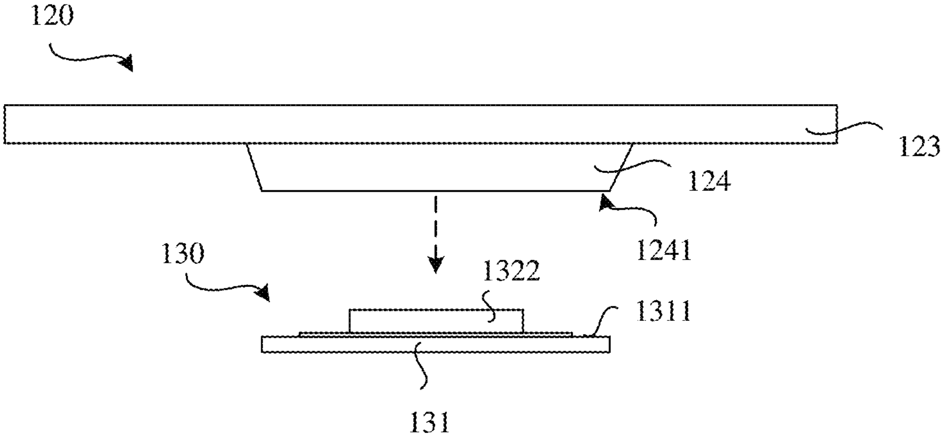
FIG. 6 is a diagram of assembly of a flow distribution plate and a heat dissipation member according to an embodiment of this disclosure.

FIG. 6 is a diagram of assembly of the flow distribution plate 120 and the heat dissipation member 130 according to an embodiment of this disclosure. With reference to FIG. 2, FIG. 4, and FIG. 6, in some embodiments of this disclosure, a limiting step 1311 may be further disposed around the bearing plate 131, and the welding face 1241 of the isolation plate 124 is welded on the limiting step 1311 in a sealed manner, and a limiting function of the limiting step 1311 is used. This prevents the flow distribution plate 120 from being affected by an external force and causing a displacement trend to damage the weld seam between the isolation plate 124 and the bearing plate 131, and ensures overall strength of the heat dissipation apparatus 100.

Still with reference to FIG. 3, in some embodiments of this disclosure, the flow inlet cavity 113 may include a direct flow cavity 1131 and a cyclone flow cavity 1132 that communicates with the direct flow cavity 1131. The direct flow cavity 1131 communicates with the first flow inlet 111, the cyclone flow cavity 1132 is located at the downstream of the direct flow cavity 1131, the second flow inlet 121 communicates with the cyclone flow cavity 1132 and the heat dissipation flow channel 1321, and the cyclone flow cavity 1132 is configured to perform cyclone flow acceleration on a fluid.

For example, as shown in FIG. 3, a cavity wall of the cyclone flow cavity 1132 that is located at the downstream of the direct flow cavity 1131 may be designed to be arc-shaped and form a flow angle with the direct flow cavity 1131. After flowing through the direct flow cavity 1131, the working medium turns to the cyclone flow cavity 1132. In the cyclone flow cavity 1132, cyclone flow acceleration may be implemented, and fluid pressure when the working medium enters the heat dissipation flow channel 1321 is increased, thereby further improving heat dissipation effect of the heat dissipation apparatus 100.

Certainly, in some embodiments of this disclosure, the heat dissipation apparatus 100 may further include a bracket 140 (as shown in FIG. 1 and FIG. 2). The bracket 140 is assembled on a mainboard on which the chip is mounted.

A mounting hole 141 is provided in the bracket 140, and the heat dissipation member 130 is assembled in the mounting hole 141, so that the heat dissipation member 130 is closer to a chip that needs heat dissipation, and heat transfer efficiency is improved. The flow distribution plate 120 is connected to the bracket 140. For example, as shown in FIG.

1 and FIG. 2. The flow distribution plate 120 may be fastened to the bracket 140 through a fastener, or certainly, a conventional connection manner such as welding or clamping may also be used.

After the bracket 140, the flow distribution plate 120, and the heat dissipation member 130 are disposed in a loose manner, the chip is pressed to dissipate heat for the chip.

With reference to FIG. 2, in some embodiments of this disclosure, a cross section of the bearing plate 131 and a cross section of the heat dissipation portion 132 are both rectangular. It may be understood that the bearing plate 131 is generally a rectangular plate, so that the bearing plate 131 can be easily mounted. Certainly, a shape of the bearing plate 131 may be specifically set based on a working condition, and is not limited to the rectangular plate. The heat dissipation portion 132 is a rectangular body, and a length of the heat dissipation flow channel 1321 can be fully increased. For example, when the heat dissipation portion 132 is a circular body, the middle heat dissipation flow channel 1321 is longer, and the heat dissipation flow channels 1321 on two sides are shorter.

Still with reference to FIG. 1 and FIG. 2, to reduce a height of the entire heat dissipation apparatus 100, in some embodiments of this disclosure, the first flow inlet 111 and the first flow outlet 112 may be disposed in a side wall of the cover plate 110.

In addition, because the flow inlet cavity 113 and the flow outlet cavity 114 in the cover plate 110 are in a hidden state, it is difficult to distinguish between the first flow inlet 111 and the first flow outlet 112. In some embodiments of this disclosure, a flow inlet identifier 115 and a flow outlet identifier 116 may be further disposed at obvious positions on the cover plate 110. For example, as shown in FIG. 1 and FIG. 2, the flow inlet identifier 115 may be disposed at a position that is on the top of the cover plate 110 and that is close to the first flow inlet 111, and the flow outlet identifier 116 may be disposed at a position that is on the top of the cover plate 110 and that is close to the first flow outlet 112.

The flow inlet identifier 115 and the flow outlet identifier 116 may be in a form of text, icon, or the like. For example, in this embodiment of this disclosure, the flow inlet identifier 115 is an English identifier "IN", and the flow outlet identifier 116 is an English identifier "OUT".

The foregoing descriptions are merely specific implementations of this disclosure, but the protection scope of this disclosure is not limited thereto. Any variation or replacement readily figured out by persons skilled in the art within the technical scope disclosed in this disclosure shall fall within the protection scope of this disclosure. Therefore, the protection scope of this disclosure shall be subject to the protection scope of the claims.

In descriptions of embodiments of this disclosure, it should be noted that, unless otherwise clearly specified and limited, the terms "installation", "connection to", and "connection" should be understood in a broad sense. For example, the connection may be fastening, may be an indirect connection by using an intermediate medium, or may be an internal communication between two elements or an interaction relationship between two elements. Persons of ordinary skill in the art may understand specific meanings of the foregoing terms in embodiments of this disclosure based on a specific situation.

In embodiments of this disclosure, it is implied that an apparatus or element in question needs to have a particular orientation, or needs to be constructed and operated in a particular orientation, and therefore cannot be construed as a limitation on embodiments of this disclosure. In the description of embodiments of this disclosure, unless otherwise exactly and specifically ruled, "a plurality of" means two or more than two.

In the specification, claims, and accompanying drawings of embodiments of this disclosure, the terms "first", "second", "third", "fourth", and the like (if existent) are intended to distinguish between similar objects but do not necessarily indicate a specific order or sequence. It should be understood that data used in such a way is interchangeable in proper circumstances, so that embodiments of this disclosure described herein can be implemented in other sequences than the sequence illustrated or described herein. In addition, the terms "include", "have", and any variants thereof are intended to cover a non-exclusive inclusion. For example, a process, method, system, product, or device that includes a series of steps or units is not necessarily limited to those clearly listed steps or units, but may include other steps or units that are not clearly listed or are inherent to the process, method, product, or device.

Finally, it should be noted that the foregoing embodiments are merely intended for describing the technical solutions of embodiments of this disclosure other than limiting embodiments of this disclosure. Although embodiments of this disclosure are described in detail with reference to the foregoing embodiments, persons of ordinary skill in the art should understand that they may still make modifications to the technical solutions described in the foregoing embodiments or make equivalent replacements to some or all technical features thereof, without departing from the scope of the technical solutions of embodiments of this disclosure.

What is claimed is:

1. A heat dissipation apparatus, configured to dissipate heat for a chip, and comprising a cover plate, a flow distribution plate, and a heat dissipation member, wherein a first flow inlet and a first flow outlet are disposed in the cover plate, a flow inlet cavity and a flow outlet cavity that are isolated from each other are disposed in the cover plate, the first flow inlet is configured to communicate with the flow inlet cavity, the first flow outlet is configured to communicate with the flow outlet cavity, and the cover plate is connected to a top face of the flow distribution plate in a sealed manner;

the heat dissipation member is connected to a bottom face of the flow distribution plate in a sealed manner, the heat dissipation member and the flow distribution plate form a sealed cavity, the heat dissipation member comprises a heat dissipation portion, the heat dissipation portion is located in the sealed cavity, and a heat dissipation flow channel is formed in the heat dissipation portion;

a second flow inlet and at least two second flow outlets are provided in the flow distribution plate, the second flow inlet is configured to communicate with the flow inlet cavity and the heat dissipation flow channel, and the second flow inlet is located between two ends of the heat dissipation flow channel; and two of the at least two second flow outlets are respectively located at the two ends of the heat dissipation flow channel, and the at least two second flow outlets communicate with the heat dissipation flow channel and the flow outlet cavity.

2. The heat dissipation apparatus according to claim 1, wherein the heat dissipation member further comprises a bearing plate, the heat dissipation portion is disposed on the bearing plate, the bearing plate is connected to the flow distribution plate in a sealed manner, and the bearing plate and the flow distribution plate are enclosed to form the sealed cavity;

the bearing plate, an end face of the heat dissipation portion, and the flow distribution plate are enclosed to form two confluence cavities, the two confluence cavities are respectively located at the two ends of the heat dissipation flow channel, and the two confluence cavities both communicate with the heat dissipation flow channel;

one of the at least two second flow outlets is configured to communicate with one of the two confluence cavities and the flow outlet cavity; and an other of the at least two second flow outlets is configured to communicate with an other of the two confluence cavities and the flow outlet cavity.

3. The heat dissipation apparatus according to claim 2, wherein the flow distribution plate comprises: a flow distribution plate main body and an isolation plate extending toward the bearing plate, the isolation plate covers the bearing plate and is welded to the bearing plate in a sealed manner;

a top of the heat dissipation portion is welded to the flow distribution plate main body; and the isolation plate, the flow distribution plate main body, the bearing plate, and the end face of the heat dissipation portion are enclosed to form the two confluence cavities.

4. The heat dissipation apparatus according to claim 1, wherein the flow inlet cavity comprises: a direct flow cavity and a cyclone flow cavity that is configured to communicate with the direct flow cavity;

the direct flow cavity is configured to communicate with the first flow inlet, and the second flow inlet is configured to communicate with the cyclone flow cavity and the heat dissipation flow channel; and the cyclone flow cavity is configured to perform cyclone flow acceleration on a fluid.

5. The heat dissipation apparatus according claim 1, further comprising a bracket, wherein the bracket is assembled on a mainboard on which the chip is mounted; and a mounting hole is provided in the bracket, the heat dissipation member is assembled in the mounting hole, and the flow distribution plate is connected to the bracket.

6. The heat dissipation apparatus according to claim 1, wherein the first flow inlet and the first flow outlet are disposed in a side wall of the cover plate.

7. The heat dissipation apparatus according to claim 1, wherein the flow distribution plate comprises a flow distribution plate main body;

the heat dissipation flow channel comprises a plurality of heat dissipation flow sub-channels, the heat dissipation portion comprises a plurality of fins, and the plurality of heat dissipation flow sub-channels are formed between the plurality of fins; and tops of the plurality of fins are welded to the flow distribution plate main body.

8. The heat dissipation apparatus according to claim 1, wherein the heat dissipation member is configured to be in contact with the chip to dissipate heat for the chip.

9. The heat dissipation apparatus according to claim 2, wherein a cross section of the bearing plate and a cross section of the heat dissipation portion are both rectangular.

10. The heat dissipation apparatus according to claim 1, wherein a size of the second flow inlet provided in the flow distribution plate is larger than a size of each of the at least two second flow outlets provided in the flow distribution plate.

11. A server, comprising a mainboard, a chip disposed on the mainboard, and a heat dissipation apparatus, wherein the heat dissipation apparatus is configured to dissipate heat for the chip;

wherein the heat dissipation apparatus is configured to dissipate heat for the chip, and comprises a cover plate, a flow distribution plate, and a heat dissipation member, wherein a first flow inlet and a first flow outlet are disposed in the cover plate, a flow inlet cavity and a flow outlet cavity that are isolated from each other are disposed in the cover plate, the first flow inlet is configured to communicate with the flow inlet cavity, the first flow outlet is configured to communicate with the flow outlet cavity, and the cover plate is connected to a top face of the flow distribution plate in a sealed manner;

the heat dissipation member is connected to a bottom face of the flow distribution plate in a sealed manner, the heat dissipation member and the flow distribution plate form a sealed cavity, the heat dissipation member comprises a heat dissipation portion, the heat dissipation portion is located in the sealed cavity, and a heat dissipation flow channel is formed in the heat dissipation portion;

a second flow inlet and at least two second flow outlets are provided in the flow distribution plate, the second flow inlet is configured to communicate with the flow inlet cavity and the heat dissipation flow channel, and the second flow inlet is located between two ends of the heat dissipation flow channel; and two of the at least two second flow outlets are respectively located at the two ends of the heat dissipation flow channel, and the at least two second flow outlets communicate with the heat dissipation flow channel and the flow outlet cavity.

12. The server according to claim 11, wherein the heat dissipation member further comprises a bearing plate, the heat dissipation portion is disposed on the bearing plate, the bearing plate is connected to the flow distribution plate in a sealed manner, and the bearing plate and the flow distribution plate are enclosed to form the sealed cavity;

the bearing plate, an end face of the heat dissipation portion, and the flow distribution plate are enclosed to form two confluence cavities, the two confluence cavities are respectively located at the two ends of the heat dissipation flow channel, and the two confluence cavities both communicate with the heat dissipation flow channel;

one of the at least two second flow outlets is configured to communicate with one of the two confluence cavities and the flow outlet cavity; and an other of the at least two second flow outlets is configured to communicate with an other of the two confluence cavities and the flow outlet cavity.

13. The server according to claim 12, wherein the flow distribution plate comprises: a flow distribution plate main body and an isolation plate extending toward the bearing plate, the isolation plate covers the bearing plate and is welded to the bearing plate in a sealed manner;

a top of the heat dissipation portion is welded to the flow distribution plate main body; and the isolation plate, the flow distribution plate main body, the bearing plate, and the end face of the heat dissipation portion are enclosed to form the two confluence cavities.

14. The server according to claim 11, wherein the flow inlet cavity comprises: a direct flow cavity and a cyclone flow cavity that is configured to communicate with the direct flow cavity;

the direct flow cavity is configured to communicate with the first flow inlet, and the second flow inlet is configured to communicate with the cyclone flow cavity and the heat dissipation flow channel; and the cyclone flow cavity is configured to perform cyclone flow acceleration on a fluid.

15. The server according claim 11, further comprising a bracket, wherein the bracket is assembled on the mainboard on which the chip is mounted; and a mounting hole is provided in the bracket, the heat dissipation member is assembled in the mounting hole, and the flow distribution plate is connected to the bracket.

16. The server according to claim 11, wherein the first flow inlet and the first flow outlet are disposed in a side wall of the cover plate.

17. The server according to claim 11, wherein the flow distribution plate comprises: a flow distribution plate main body;

the heat dissipation flow channel comprises a plurality of heat dissipation flow sub-channels, the heat dissipation portion comprises a plurality of fins, and the plurality of heat dissipation flow sub-channels are formed between the plurality of fins; and tops of the plurality of fins are welded to the flow distribution plate main body.

18. The server according to claim 11, wherein the heat dissipation member is configured to be in contact with the chip to dissipate heat for the chip.

19. The server according to claim 12, wherein a cross section of the bearing plate and a cross section of the heat dissipation portion are both rectangular.

20. The server according to claim 11, wherein a size of the second flow inlet provided in the flow distribution plate is larger than a size of each of the at least two second flow outlets provided in the flow distribution plate.

* * * * *